United States Patent [19]
Cronin

[11] Patent Number: 5,818,110
[45] Date of Patent: Oct. 6, 1998

[54] INTEGRATED CIRCUIT CHIP WIRING STRUCTURE WITH CROSSOVER CAPABILITY AND METHOD OF MANUFACTURING THE SAME

[75] Inventor: John Edward Cronin, Milton, Vt.

[73] Assignee: International Business Machines Corporation, Armonk, N.Y.

[21] Appl. No.: 755,077

[22] Filed: Nov. 22, 1996

[51] Int. Cl.$^6$ ................................................ H01L 23/48
[52] U.S. Cl. ........................ 257/775; 257/776; 257/923; 438/660; 438/637
[58] Field of Search ................................ 438/624, 637, 438/660; 257/775, 776, 920, 923

[56] References Cited

U.S. PATENT DOCUMENTS

| | | |
|---|---|---|
| 1,035,592 | 2/1912 | Clark . |
| 3,366,519 | 1/1968 | Pritchard . |
| 4,600,624 | 7/1986 | Joseph et al. . |
| 4,746,621 | 5/1988 | Thomas et al. . |
| 4,776,087 | 10/1988 | Cronin et al. . |
| 4,789,648 | 12/1988 | Chow et al. . |
| 4,962,058 | 10/1990 | Cronin et al. . |
| 4,985,990 | 1/1991 | Cronin et al. . |
| 4,987,101 | 1/1991 | Kaanta et al. . |
| 4,997,746 | 3/1991 | Greco et al. . |
| 5,110,712 | 5/1992 | Kessler et al. . |
| 5,136,124 | 8/1992 | Cronin et al. . |
| 5,144,411 | 9/1992 | Kaanta et al. . |
| 5,158,910 | 10/1992 | Cooper et al. . |
| 5,169,802 | 12/1992 | Yeh . |
| 5,198,298 | 3/1993 | Haskell et al. . |
| 5,229,257 | 7/1993 | Cronin et al. . |
| 5,244,837 | 9/1993 | Dennison . |
| 5,371,047 | 12/1994 | Greco et al. . |

FOREIGN PATENT DOCUMENTS

| | | |
|---|---|---|
| 86114396.4 | 10/1986 | European Pat. Off. . |
| 59-161048 | 9/1984 | Japan . |

OTHER PUBLICATIONS

S. Wolf et al. "Silicon Processing for the VLSI Era: vol. 1" Lattice Press (Calif). pp. 549–552, 1986.

H.H. Berger, Conductor Crossings in Monolithic Circuits, Feb., 1971, vol. 13, No. 9.

W.J. Cote, J.E. Cronin, R.E. Scheuerlein, Customized Metallization for Low Capacitance or Low Resistance, Nov., 1985, vol. 28, No. 6.

J.E. Cronin, C.W. Kaanta, Variable Depth Contact Hole Preparation Utilizing a Nucleation Layer and Selective Chemical Vapor Deposition for Stud Formation, Jun., 1986, vol. 29, No. 1.

J.E. Cronin and R.A. Horr, Optical Thickness Monitor for Continuous Vapor Deposited Film, Aug., 1986, vol. 29, No. 3.

J.E. Cronin, Chemical Vapor Deposition of Tungsten to Fill Oversize Vias, J.E. Cronin, Dec., 1986, vol. 29, No. 7.

J.E. Cronin and C.W. Kaanta, Modification of Interlevel Via Design to Lower Line Resistivity, Mar., 1987, vol. 29, No. 10.

(List continued on next page.)

*Primary Examiner*—Caridad Everhart
*Attorney, Agent, or Firm*—Schmeiser, Olsen & Watts; Steven J. Soucar

[57] ABSTRACT

An integrated circuit chip wiring structure having crossover and contact capability without an interlock via layer and a method of making the wiring structure all disclosed. The method utilizes a multi-damascene approach, using the standard damascene processing steps to wire the first, then metallization layer, then providing the second, thick metallization layer with first regions for metal wire. A conformal coating is deposited, filling the second regions but not the first regions. When an etch is performed, the layers underlying the second regions are exposed but not those underlying the second regions. Therefore, it is possible to selectively expose the metal lines in the first layer so that electrical connection is made with the metal wire of the second layer in the exposed areas. Electrical isolation is maintained in the narrower, second regions of metal wire.

16 Claims, 6 Drawing Sheets

OTHER PUBLICATIONS

J.E. Cronin and C.W. Kaanta, Method for Obtaining Low Resistance and Low Capacitance Metalization Using Single Metal Deposition, May, 1988, vol. 30, No. 12.

J.E. Cronin, S.P. Hollard and C.W. Kaanta, Optimum Metal Line Structures for Memory Array and Support Circuits, May, 1988, vol. 30, No. 12.

D.B. Eardley and P.T. Liu, using Contact Studs Alone for Short Interconnections in Memory Cells, May, 1988, vol. 30, No. 12.

W.J. Cote, J.E. Cronin, K.L. Holland and C.W. Kaanta, Reliable and Extendable Wiring Process for Logic, Oct., 1988, vol. 31., No. 5.

J.E. Cronin and P.A. Farrar, Elimination of CMOS Electromigration–Induced Extrusions, Nov., 1988, vol. 31, No. 6.

J.E. Cronin, K.L. Holland and C.W. Kaanta, Materials, Masking and Etching Technique for Fabricating Semiconductor Stud–Up Interconnections, Aug., 1989, vol. 32, No. 3A.

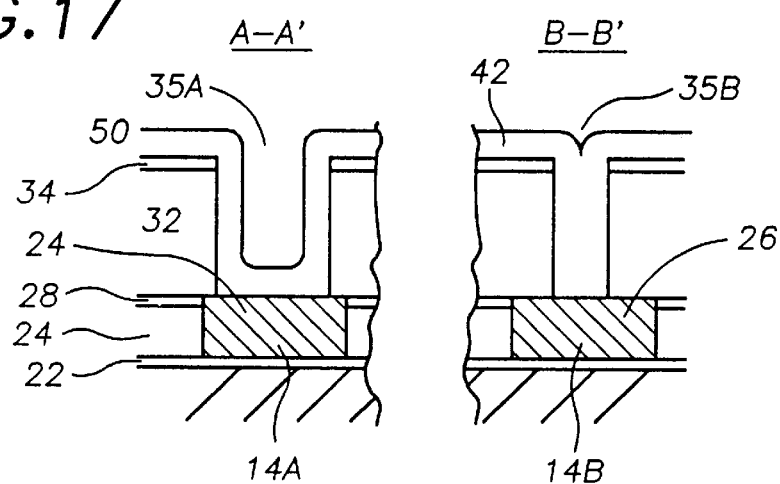
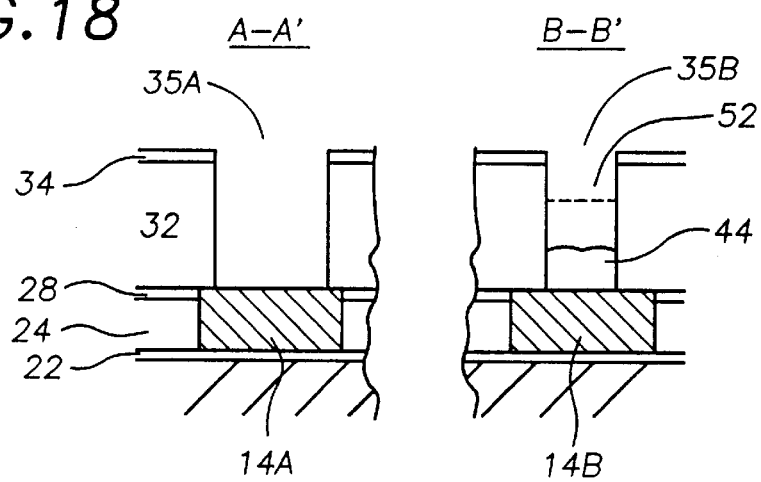
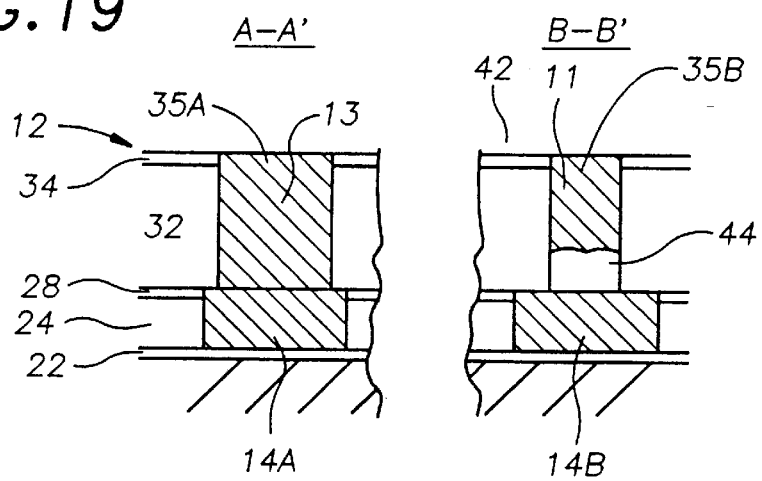

INTEGRATED CIRCUIT CHIP WIRING STRUCTURE WITH CROSSOVER CAPABILITY AND METHOD OF MANUFACTURING THE SAME

TECHNICAL FIELD

This invention generally relates to the manufacturing of integrated circuit chip wiring structures, especially dynamic random access memory (DRAM) chips, and more specifically relates to a method of producing these chips without the use of vias between some layers, while still providing cross-over and contact capabilities.

BACKGROUND OF THE INVENTION

Integrated circuit (IC) chips, for example dynamic random access memory (DRAM) and static random access memory (SRAM), require different resistance and capacitance limits in the cell array wiring and the sense amplifier/decode and support circuits. In the array wiring, the conductor is customized for low capacitance. For example, in a typical 4 Megabit (M) DRAM the capacitance (C) is less than or equal to ($\leq$) 0.15 femptofarads per micron (ff/$\mu$m) in bitline-to-bitline wiring at the expense of resistance (R), which is less than or equal to 1 ohm per square ($\Omega/\square$). On the other hand, in the supports and decode circuits (the logic circuits), the resistance is optimized (R$\leq$0.07$\Omega/\square$), while capacitance is less crucial (C$\leq$0.25 ff/$\mu$m).

In order to achieve these resistance and capacitance limits, the pitch, which is defined as the width of the line plus the space between the lines, of the wiring structure must be carefully controlled. In order for the wiring to be suitable for the array requirements (capacitance and resistance), the pitch must be as near as possible to the smallest photolithographically achievable size (minimum pitch). Although some minimum pitch wiring is needed in the supports, for the most part the logic circuitry has a pitch about two times the minimum pitch in order to carry the signals with the requisite lower resistance. Various ways of creating the necessary line widths have been suggested. See Cronin, J. and C. Kaanta, "*Thickness Controlled Thick and Thin Lines in One Damascene Level*", IBM TECHNICAL DISCLOSURE BULLETIN (TDB) No. 7, at 393–94 (December 1990); Cronin, John, "*Method to Make Thin and Thick Lines Within a Single Level of Damascene Wiring Using a Single Photomask*", IBM TDB No. 7 at 387 (December 1990); Cronin et al., "*Optimum Metal Line Structures for Memory Array and Support Circuits*", IBM TDB Vol. 30, No. 12, at 170–71 (May 1988); Cronin et al., *Method for Obtaining Low Resistance and Low Capacitance Metalization* (Sic) *Using Single Metal Deposition*, IBM TDB Vol. 30, No. 12, at 142–43 (May 1988); and Anonymous, *Process to Make Thick and Narrow Conductive Lines*, IBM RESEARCH DISCLOSURE, No. 313 (May 1990).

As shown in FIG. 1, the necessary line widths were initially constructed by depositing and defining a first metal layer M1 that was thin, covering the first metal layer M1 by depositing a layer of an insulating material I, followed by depositing and defining a second metal layer M2 that was thick. Contacts between the first and second metal layers M1, M2 were formed by etching a tapered via V through the insulator I and then depositing the second metal layer M2 over the insulator I. Thus, contact was made between the first and second layer M1, M2 through the tapered via V.

It was then found that a planarized layer of insulative material was desirable for improved photolithographic resist image definition (the planar surface minimized depth of field problems). FIG. 2 illustrates the solution wherein a first metal layer (thin) M was deposited and defined. The insulator I was next deposited over the entire surface and planarized. Studs S were formed by etching a vertical via V through the insulator layer I, depositing a stud via metal M3 therein, and planarizing the surface. The second metal layer (thick) M2 was then applied and patterned so that connection between first and second metal M2, M2 was made through the stud via S.

As shown in FIG. 3, further improvements to minimize cost by eliminating processing steps and materials were made by combining the stud via metal with the second metal layer M2. In this method, the first metal layer (thin) M1 was defined and deposited followed by an insulator layer I which was deposited and planarized. The second metal layer's M2 wiring lines in the insulator I were defined as trenches T and stud vias S were defined as holes H. Metal was deposited to fill the trenches T and holes H and the metal was then planarized. Metal was deposited to fill the trenches T and holes H and the metal was then planarized. By defining the trenches T first and then the studs S, before metallizing, the one metal deposition filled both the trenches T and holes H thereby saving costs. This approach to wiring is known as the "damascene approach".

The "damascene" approach to wiring is well known in the industry. It comprises depositing an insulator over the semiconductor device structures, e.g. M1. Next, the insulator is planarized by a chemical-mechanical polish (CMP) process. A resist material is applied, exposed to an energy source, and developed, leaving openings in certain regions. These openings define wiring channel regions/trenches. The insulator exposed in the resist openings is subjected to a reactive ion etch (RIE) to remove the exposed areas of insulator. The remaining resist material is then removed, leaving the planar insulator with channels or trenches cut into it. A conformal metal is applied over the entire surface, filling all the trenches and covering all the insulator surfaces. The metal is removed by a planarization, e.g., a CMP, process. The metal is only left in the trenches, forming wiring channels.

Adding a via level requires extra layers which must be sequentially defined. Each additional step to the process requires another alignment step, which increases the likelihood of failure of the final product. Additionally, each processing step requires further handling of the chips which increases cycle time. By reducing the number of steps and layers, there is a reduction in handling and delays, which also tends to increase the yield of the chips because there are fewer defects introduced through handling. In addition, yield is enhanced by the elimination of process variables related to the uncontrolled delays which are created when the chips are processed with several extra steps in the production line. The processing characteristics of the materials used in the production of the chips can vary depending on extent of time elapsed from one processing step to the next. By reducing the number of steps, these delays are reduced and more repeatable, thus reducing process variability. These increases in yield result in cost savings to the manufacturer. Additionally, the removal of the intervening insulator results in cost savings both because of the reduced material costs and because of the reduced handling costs.

In the manufacture of dynamic random access memory ("DRAM") chips, containing the costs of production is essential. One way of reducing cost is to eliminate as many process steps as possible. One possibility is to eliminate a separate, trapped via level between the first metal and the second metal, if possible. Typically the first metal is a thin layer while the second metal is thick. Since the thin metal is required only in the DRAM array for low capacitance and the thick metal is required in the supports for low resistance, one could limit the design rules so that a cross-over between the thin and thick lines is not required and therefore a via connection between the thick and thin layers is not required. However, it should be noted that a via level between two wiring levels allows the two levels to cross each other, and connect when a via is defined at the cross-over, but not connect if there is no via at the crossover.

FIGS. 4 and 5 show two variations of an approach called the "multi-damascene" approach, that create thick and thin wiring levels without both a separate, trapped via level and cross-over capability. The method, as shown in the FIGS. 4 and 5, creates thin lines M1 by the damascene method in a thin insulator $I_{thin}$, followed immediately by a second, thick line M2 in a thick insulator $I_{thick}$ by the damascene method. Where the thin and thick lines M1, M2 cross, at the intersection, they electrically connect C. A via which is normally used between the thin line and the thick line, is left out, since crossing over without connection is not needed in the DRAM design case. By removing the intervening insulator and via connection level, cost is reduced. However, there are times in more complex, logic intensive DRAMs (high density synchronomous DRAMs and video DRAMs) when some amount of cross-over is necessary.

That is, standard interconnection systems use two levels of damascene, a first level and a second level. These levels are insulated from each other by an intervening insulator material. When a second level crosses over a first level, no electrical connection is made because the levels are insulated from each other by the intervening insulator. When electrical connection is required between the first and second level, a conductive via is defined in the intervening insulator at the intersection where electrical connection is to be made. This gives the designer total wiring flexibility and is, therefore, more desirable than the previous instance, in which every time crossover occurs, there is electrical connection.

Other ways of obtaining thick and thin lines were explored including, manufacturing the chip to have the thick and thin lines in different areas of the chip, so they were decoupled from each other. The lines were either manufactured as part of the same plane, as shown in IBM TDB Vol. 30, No. 12 at 142–43 (May 1988) or, using various methods, as a thick portion and a thin portion in different planes, as discussed above. Typically, wherever the lines were there was no via between them. On the other hand, whenever connections were needed, the vias were used with a layer of an insulative material between the two metallization planes. As can be seen, the methods described of creating the thick lines in one area and thin lines in a different area either: a.) consume a lot of "real estate" on the chip surface or b.) do not allow cross-over unless an intervening insulative layer is used, in which case the vias were necessary.

There exists a need for a structure in which the second level is normally insulated from the first level at cross-overs, but a via would not be required when the electrical connection of the thin and thick lines was desirable. This specific case occurs in DRAM and SRAM circuits, where two wiring levels are needed for electrical design considerations, i.e., low capacitance (thin) array wiring and low resistance (thick) support wiring. These thick and thin levels are defined by the damascene technique. When some insulated cross-over of thin and thick lines is needed, particularly in those regions between arrays and for running thick power buses in the array, it would be most effective to do so without the need for an entire level of via wiring (insulator/mask/via/conductor). Fortunately, these insulative cross-over regions do not require the layout considerations (density) that adding a via would allow for. Therefore, a method for wiring thin and thick wires with some low density (large layout area) cross-over capability is needed.

SUMMARY OF THE INVENTION

The present invention is a novel integrated circuit (IC) chip wiring structure and the method for producing it. The IC chip's wiring structure is manufactured and laid out in such a manner that the thick or low resistance plane may cross over the thin or low capacitance plane by manipulating the processing steps. The use of vias, with the associated mask alignment problems and costs is obviated by this new method of applying the various layers to the substrate surface.

The method comprises applying a first layer of an insulative or passivating material, etching it away wherever a thin wire is going to be needed, and metallizing the etched area. Then a thin etch stop layer is applied. Next, a second, thick wiring layer insulator is applied to the surface over the etch stop and the thin layer, the thick insulator being etched to form openings that are made narrow in the areas where cross-over is necessary and made wide in areas where cross-over connections are needed. A conformal coating of paralene or a like material is deposited, replicating the wide areas but filling the narrow areas. This is followed by etching the paralene either isotropically or directionally, exposing the etch stop layer in the wide areas to further etching. The etch stop is then etched exposing the thin layer only in the regions where the thick layer has wide openings. However, this process also prevents the narrow areas from being etched, thereby preventing the etching of the etch stop layer beneath the areas of narrowness, hence, allowing the wires to be electrically insulated from each other wherever the thick wire is made narrow.

Numerous other advantages and features of the present invention will become readily apparent from the following detailed description of the invention, the drawings and the appended claims.

BRIEF DESCRIPTION OF THE DRAWINGS

In the drawings:

FIGS. 17–19 are schematics of cross-sectional views taken across lines A–A' and B–B' of FIG. 6 depicting steps of an alternative embodiment of the present invention.

DETAILED DESCRIPTION OF THE PREFERRED EMBODIMENTS

Figure 1:
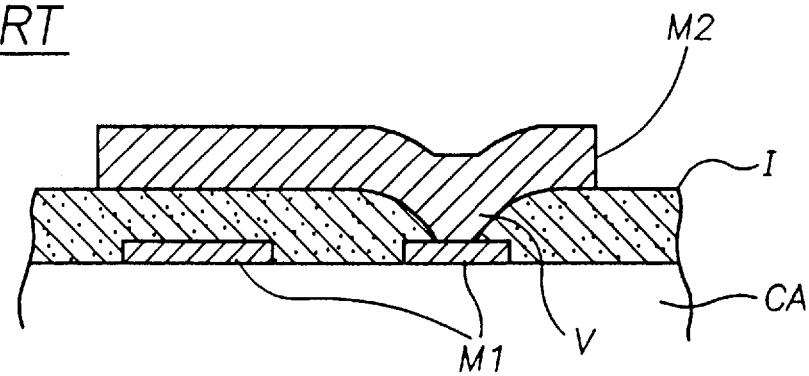
FIG. 1 is a prior art schematic of tapered via.
Figure 2:
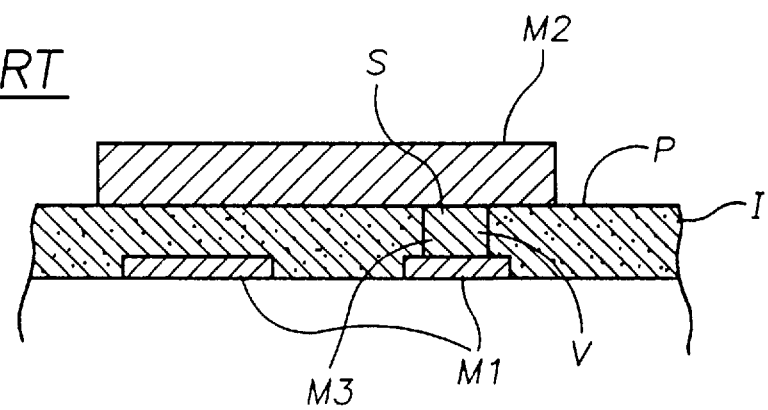
FIG. 2 is a prior art schematic of a stud via.
Figure 3:
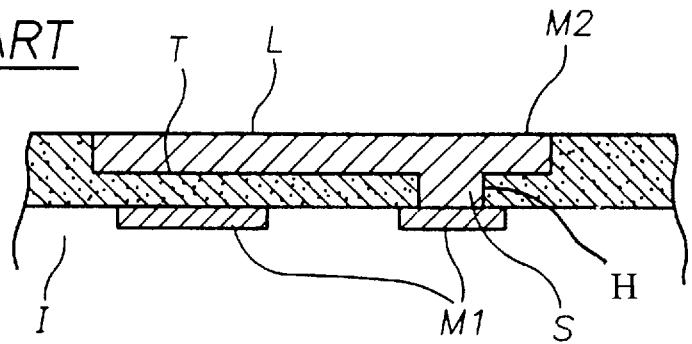
FIG. 3 is a prior art schematic of a dual damascene via.
Figure 4:
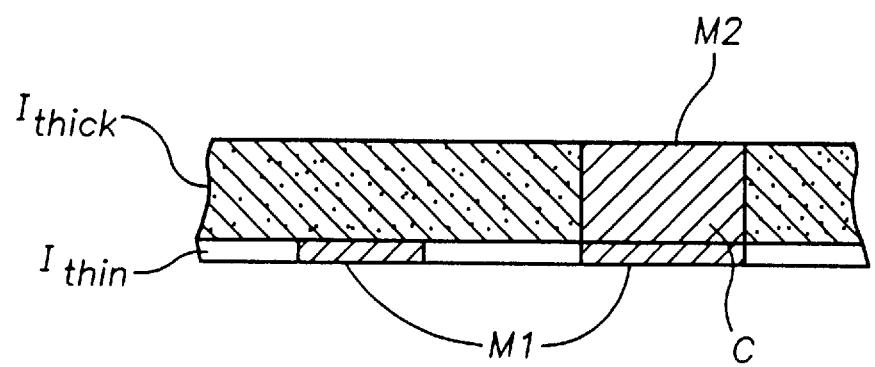
FIG. 4 is a prior art schematic of a "multi-damascene" connection.
Figure 5:
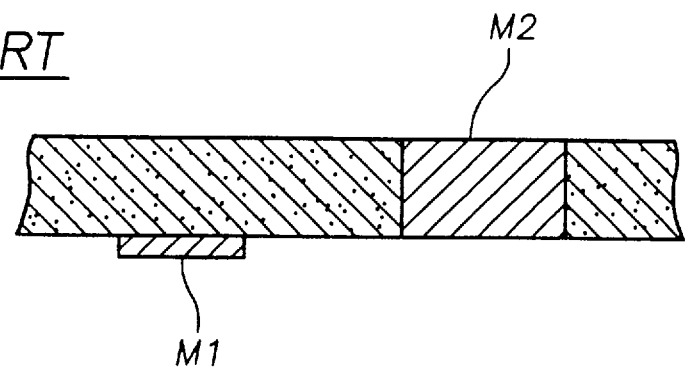
FIG. 5 is a prior art schematic of the "multi-damascene" approach showing an area without contact.

While this invention is susceptible to embodiment in many different forms, there is shown in the drawings and will be described in detail, preferred embodiments of the invention. It should be understood, however, that the present disclosure is to be considered as an exemplification of the principles of this invention and is not intended to limit the invention to the embodiment illustrated.

Figure 6:
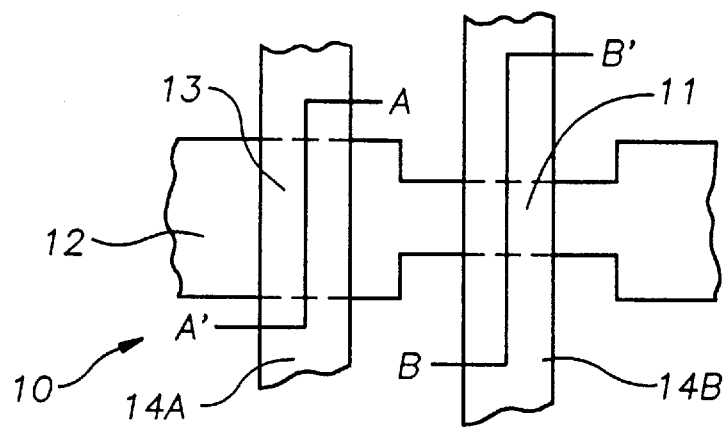
FIG. 6 is a top view of a cross-over in a wiring structure embodying the present invention.

As shown in FIG. 6, the cross-over structure 10 of the preferred embodiment of the present invention comprises a thick wire line 12 and thin wires lines 14A, 14B, the thick wire 12 crossing over the thin wire 14. The thick wire passes over the thin wire without any electrical contact being made in region 11 while connection is made in region 13. This is accomplished without the use of additional masks and associated processing steps by the method disclosed below.

Figure 7:
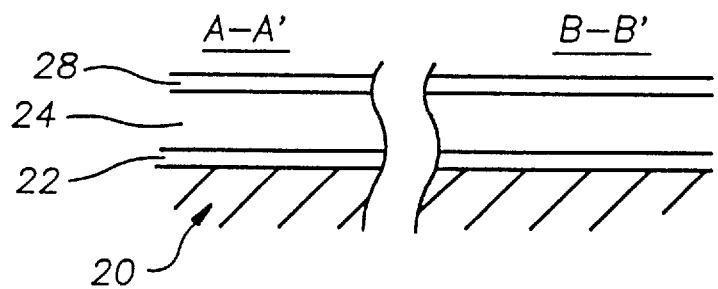
FIGS. 7–16 are schematics of cross-sectional views taken across lines A–A' and B–B' of FIG. 6 depicting in a step-wise fashion a method of manufacturing the cross-over in the wiring structure embodying the present invention.

As shown in FIG. 7, the first step is to provide a substrate 20 and a first etch stop layer 22 on the surface of the substrate 20, as is commonly done in the art. The first etch stop 22 layer is applied and is preferably either a silicon nitride or a silicon oxide depending on which etchants are being used and what material is being selectively etched. A first insulative material 24 is applied over the surface of the first etch stop 22. The first insulative material is preferably a polyimide, however, other insulating or passivating materials exhibiting low dielectric constant and being etchable in a gas composition that will not etch the etch stop also be used. The first insulative material 24, typically a thin layer of polyimide, may be applied by spin coating and the desired thickness is usually around 2,000 Angstroms (Å). This layer may, however, be deposited in any manner known in the art. A second etch stop layer 28, again preferably CVD deposited nitride, is then applied to the surface of the first thin insulative material 24, resulting in the structure shown in cross-section in FIG. 7.

Figure 8:
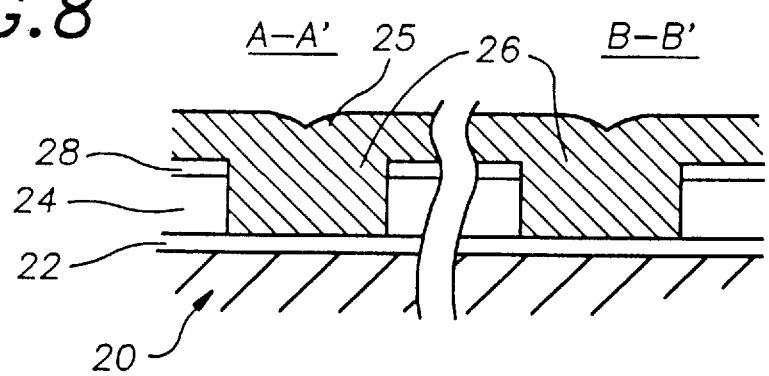
Figure 9:
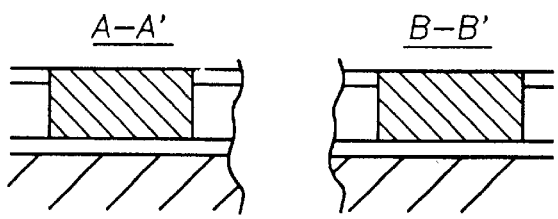

As shown in FIG. 8, the first insulative material 24, and the second etch stop 28 layer are then defined, etched, and a conformal metal 25 is deposited. The normal definition process is to apply a layer of a photoresist material, expose the resist in certain places and develop it. After developing the photoresist, the areas which are not covered by the photoresist polymer are then etched away by a reactive ion etch (RIE) down to the first etch stop layer 22. The resist is removed and then the structure is metallized. The structure is then planarized by a chemical-mechanical polish (CMP) by standard procedures to form at least one metal line 26, as shown in FIG. 9. The process embodied in FIGS. 8 and 9 is known as the damascene technique, the results of which are shown in FIG. 9.

The metal may be one of a number of different metals or alloys including: titanium/titanium nitride/tungsten, tantalum-copper/copper, titanium-aluminum-copper, or aluminum. These metals may be deposited in one of the known manners, preferably by chemical vapor deposition, or physical deposition, such as evaporation or sputtering, or by plating. Sputter deposition of a thin titanium/titanium nitride followed by a chemical vapor deposition of tungsten metal followed by CMP of tungsten is the technique that is favored for its accuracy and reliability.

Figure 10:
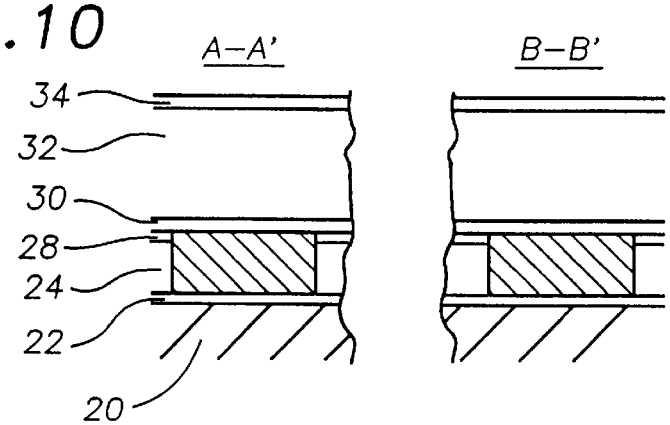
Figure 11:
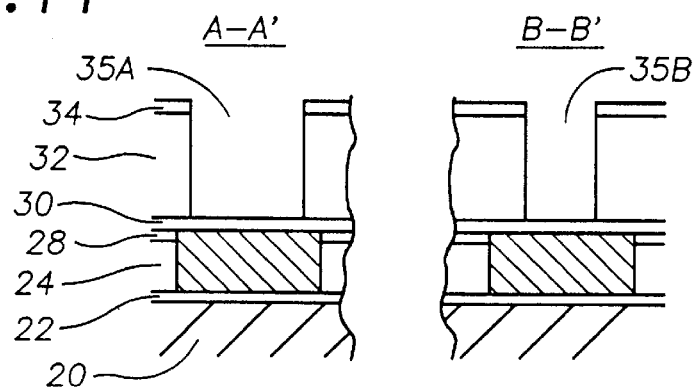

As shown in FIG. 10, a third etch stop layer 30 is applied next. A second insulative material 32 is applied, typically to about 10,000 Å, again preferably by spin coating, and another etch stop layer 34 is applied. The second insulative material layer 32 is also referred to as the "thick" layer because it is much thicker than the previous layers, albeit the second insulative material layers 32 can be a thin layer if desired. The thick wiring layer is defined as a first or wide region, 35A and as a second or narrow region, 35B. The wide region will only be filled partially during the subsequent deposition steps, whereas the narrow region will be completely filled. Because of the varying fill, the etches will affect the two areas differently, i.e., the narrow regions will retain some of the barrier layer whereas the wide regions will be etched through to the underlying layers. This "trick" is what allows connection in one area while maintaining electrical isolation in the other area. The reactive ion etch of the exposed areas stops on the third etch stop layer 30, as shown in FIG. 11.

Figure 12:
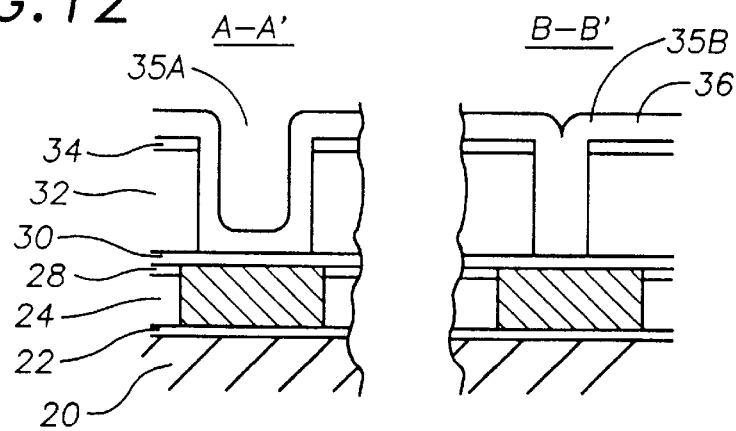
Figure 13:
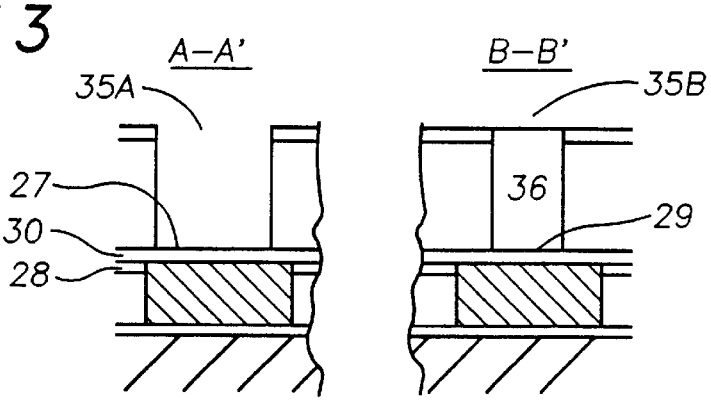

As shown in FIG. 12, a layer of paralene 36, or a similar conformal coating is then deposited and conformally coats the surface of the first and second regions 35A and 35B. The second region 35B is filled whereas first region 35A is not. The paralene 36 is then etched back in an oxygen plasma, using either an isotropic etch or a directional reactive ion etch. The results of the isotropic etch are shown in FIG. 13. As can been seen, the second region 35A is filled with paralene 36, but all paralene is selectively removed in the first region 35A. If a directional etch were used, the horizontally planar portions of the paralene would be removed and the portions which are adjacent the side walls would remain. The paralene is selectively removed where electrical contact with the metal line 26 is desired.

Figure 14:
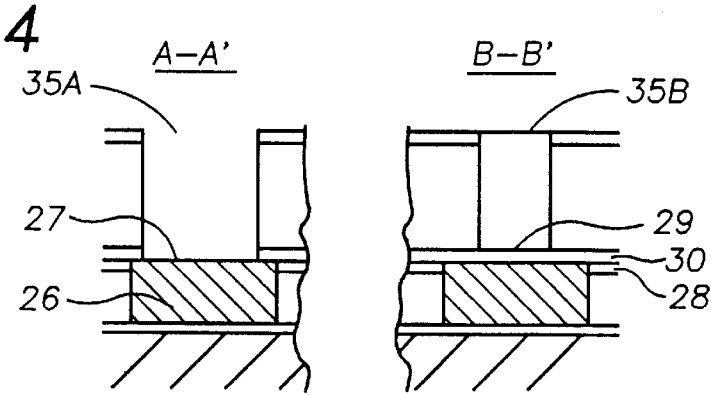

As shown in FIG. 14, the third etch stop material 30 is exposed in region 27 on the surface but in other regions i.e., 29, it remains covered by paralene. The exposed third etch stop material 30 in region 27 is then preferably etched back by a reactive ion etch process. A $CF_4+O_2$ reactive ion etch is the etch of choice. This will expose the metal line 26 under the third etch stop material 30 where connection is desired at wide region 35A. However, etch stop 30 is left intact in trough 35B, where electrical isolation from the underlying thin wire is desired.

Figure 15:
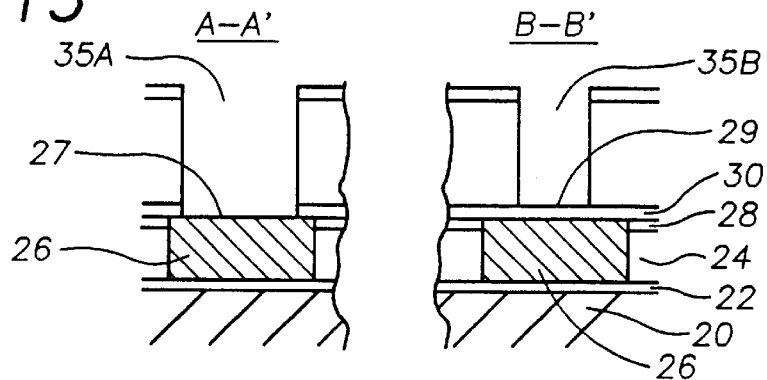
Figure 16:
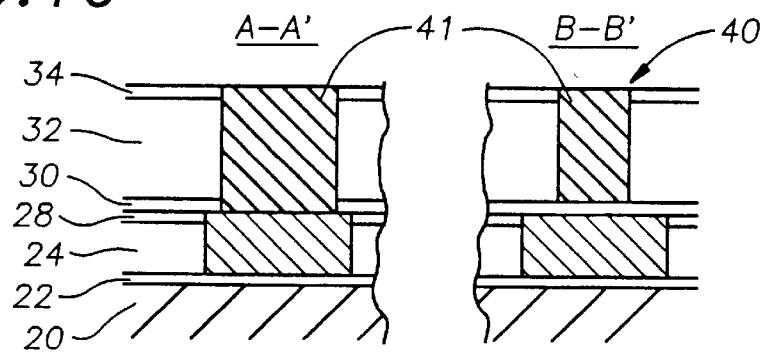

The remaining paralene 36 is removed by an $O_2$ plasma ash in the next step as shown in FIG. 15. The now-empty troughs are then metallized to form a second metallization layer 40 which is polished back and planarized, so that a metal wire or line 41 is even with the layer of etch stop 32, as shown in FIG. 16.

In this manner, a wiring structure is formed, having a first and second wiring layer, in which the first, thin wiring layer is defined, metal deposited, and polished back, then the second, thick wiring layer is defined, deposited, and polished back in such a manner to allow contact in the desired areas, but to electrically insulate the wires of the first and second wiring layers in other areas. The metal lines in the first wiring layer and the metal wires of the second wiring layer may be made of the same material, may be the same thickness, and may be the same width. The difference is merely one in nomenclature to more easily differentiate the wires in the first layer from the wires that are formed in the second layer.

An alternative method is shown in FIGS. 17–19. Layers 22, 24, 28, 30, 32, 34 are defined as before, and metal 26 is also defined as before. However, a departure is made at FIG. 10, where the third etch stop 30 is not deposited (nor required).

After wide regions 35A and narrow regions 35B are defined, both metal lines 14A, 14B are exposed. Insulator 42, e.g., paralene, is deposited as before, filling region 352, but not filling region 35A, shown by line 50 in FIG. 17. After isotropic etching, dotted line 52 represents the paralene left in only the narrow regions, as depicted in FIG. 18. Next, isotropic plasma $O_2$ is continued, leaving a small portion 44 of paralene left covering metal line 14A. Again, this can be done because of the differences in the width of the lines in regions 35A and 35B. As shown in FIG. 19, the final structure is metallized and planarized in a manner similar to FIG. 11. The small portion 44 remains to insulate region 11 from line 14B.

The foregoing specification is intended as illustrative and is not intended to be taken as limiting. Still other variations within the spirit and scope of this invention are possible and will readily be apparent to those skilled in the art.

Accordingly, what is claimed is:

1. A metallization interconnect system comprising:
    a substrate;
    a first layer of insulative material on the substrate having at least one metal line therein;
    an insulative barrier; and
    a second layer of insulative material on the first layer of insulative material having at least one metal wire therein, wherein the metal wire has a first region with a greater width than a second region, wherein the metal line intersects with the metal wire in the first region, and wherein the insulative barrier maintains electrical isolation between the metal line and the metal wire in the second region.

2. The metallization interconnect system of claim 1, wherein the second layer of insulative material is thicker than the first layer of insulative material.

3. The metallization interconnect system of claim 1 wherein the insulative barrier is between the first layer and the second layer.

4. The metallization interconnects system of claim 1 wherein the insulative barrier is only between the metal line and the metal wire in the second region.

5. The metallization interconnect system of claim 1, wherein the metal line is a metal selected from the group consisting of: titanium/titanium nitride chemical vapor deposited tungsten; aluminum; aluminum copper; aluminum copper silicide; chemical vapor deposited tungsten; tungsten; copper and silver.

6. The metallization interconnect system of claim 1, wherein the second metal line is a metal selected from the group consisting of: titanium/titanium nitride chemical vapor deposited tungsten; aluminum; aluminum copper; aluminum copper silicide; chemical vapor deposited tungsten; tungsten; copper and silver.

7. A method for manufacturing an integrated circuit chip having a metallization interconnect system comprising the steps of:
    providing a substrate;
    depositing a first etch stop on the substrate;
    depositing a first layer of insulative material on the first etch stop and a second etch stop on the first layer of insulative material, the first layer of insulative material and the second etch stop layer having at least one first metal line therein;
    depositing a third etch stop layer on the second etch stop layer and first metal line;
    depositing a second layer of insulative material on the third etch stop layer;
    defining a second metal line trough having a first region and a second region, wherein the first region has a greater width than the second region;
    depositing a conformal coating over the entire surface defined by the trough and the third etch stop layer, thereby filling the second region of the metal line trough but not completely filling the first wire region;
    etching the conformal coating, thereby exposing a portion of the third etch stop layer in the first region of the metal wire trough while leaving the conformal coating in the second region;
    removing the exposed portion of the third etch stop layer in the first region;
    removing the conformal coating that was left in the second region, thereby exposing the third etch stop layer in the second region which acts as an insulative barrier;
    metallizing the trough; and
    planaring the surface, thereby forming the metallization interconnect system of the integrated circuit chip wherein the insulative barrier maintains electrical isolation between the metal line and the metal wire in the second region.

8. The method of claim 7, wherein the conformal coating is isotopically etched.

9. The method of claim 7, wherein the conformal coating is directionally etched.

10. The method of claim 7, wherein the planarization steps are chemical-mechanical polishes.

11. The method of claim 7, wherein the metallization steps are selected from the group consisting of chemical vapor depositions and sputter depositions.

12. A method for manufacturing a metallization interconnect system having: a first layer of insulative material having at least one first metal line therein; an insulative barrier; and a second layer of insulative material on the surface of the first layer of insulative material having a second metal line therein, wherein the second metal line has a first region with a greater width than a second region, comprising the steps of:
    selectively removing the insulative barrier from the first region before metallizing the second metal line.

13. The method of claim 12, wherein the selective removal of insulative barrier from the first region further comprises the steps of:
    conformally coating the second layer of insulative material with the insulative barrier material, and etching the insulative barrier, which exposes the first layer of insulative material and the first metal line in the first region.

14. The method of claim 12, wherein the selective removal of the insulative barrier from the first region further comprises the steps of:
    coating the second layer of insulative material with a conformal coating;
    etching the conformal coating, thereby exposing portions of an etch stop layer located between the first layer of insulative material and the second layer of insulative material in the first region while leaving the conformal coating in the second region;
    removing the exposed portions of the etch stop layer;
    removing the conformal coating that was left in the second region; and
    metallizing the second metal line.

15. The method of claim 14, wherein the conformal coating is etched by an isotropic etch.

16. The method of claim 14, wherein the conformal coating is etched by a directional etch.

* * * * *